United States Patent
Ricks

(10) Patent No.: US 6,613,243 B2
(45) Date of Patent: Sep. 2, 2003

(54) METHOD OF MAKING A 3-D STRUCTURE USING AN ERODABLE MASK FORMED FROM A FILM HAVING A COMPOSITION THAT VARIES IN ITS DIRECTION OF THICKNESS

(75) Inventor: Neal Ricks, Blacksburg, VA (US)

(73) Assignee: Shipley Company, L.L.C., Marlborough, MA (US)

( * ) Notice: Subject to any disclaimer, the term of this patent is extended or adjusted under 35 U.S.C. 154(b) by 0 days.

(21) Appl. No.: 09/911,834

(22) Filed: Jul. 25, 2001

(65) Prior Publication Data

US 2002/0084251 A1 Jul. 4, 2002

Related U.S. Application Data

(60) Provisional application No. 60/221,217, filed on Jul. 25, 2000.

(51) Int. Cl.[7] .................................................. C23F 1/00
(52) U.S. Cl. .............................. 216/66; 216/67; 216/72; 216/74; 216/75; 216/50
(58) Field of Search .............................. 216/66, 67, 72, 216/74, 79, 80, 90; 438/706

(56) References Cited

U.S. PATENT DOCUMENTS

| | | |
|---|---|---|
| 4,092,210 A | 5/1978 | Hoepfner |
| 4,461,672 A | 7/1984 | Musser |
| 4,908,333 A | 3/1990 | Shimokawa et al. |
| 4,938,841 A | 7/1990 | Shahar et al. |
| 5,275,695 A | 1/1994 | Chang et al. |
| 5,310,623 A | 5/1994 | Gal |
| 5,480,764 A | 1/1996 | Gal et al. |
| 5,528,080 A * | 6/1996 | Goldstein .................... 257/741 |
| 5,528,082 A * | 6/1996 | Ho et al. ..................... 257/775 |
| 6,303,447 B1 * | 10/2001 | Chhagan et al. ............ 438/299 |
| 6,396,078 B1 * | 5/2002 | Uochi et al. .................. 257/66 |

* cited by examiner

Primary Examiner—Robert Kunemund
Assistant Examiner—Binh X. Tran
(74) Attorney, Agent, or Firm—Dann, Dorfman, Herrell & Skillman, P.C.

(57) ABSTRACT

A method of producing surface features in a substrate includes steps of forming a film having a composition that varies in the direction of its thickness on the substrate, forming a mask on the heterogeneous film, etching the film to thereby pattern the film, and etching the structure that includes the patterned film to erode the film and correspondingly shape the substrate as the film is so being eroded. In this way, the pattern of the film is transferred to the substrate in a manner dependent on the selectivity of one or both of the etching processes as well as the thickness of the discrete mask layers, or in the case of a continuously graded film, the "slope" of the stoichiometric change with respect to position in the overall thickness of the film.

15 Claims, 4 Drawing Sheets

METHOD OF MAKING A 3-D STRUCTURE USING AN ERODABLE MASK FORMED FROM A FILM HAVING A COMPOSITION THAT VARIES IN ITS DIRECTION OF THICKNESS

This application claims the benefit of U.S. Provisional Application No. 60/221,217 filed Jul. 25, 2000.

FIELD OF THE INVENTION

The present invention relates to miniature optical components, such as lenslets and optical components of data communications equipment. More specifically, the present invention relates to a method of manufacturing a three-dimensional structure that may be used as an optical component. However, the present invention has applicability to various other fields requiring the manufacturing of a substrate having minute surface features characterized by intricately shaped side walls.

BACKGROUND

The increasing demand for high-speed voice and data communications has led to an increased reliance on optical communications, particularly fiber optic communications. The use of optical signals as a vehicle to carry channeled information at high speeds is preferred in many instances to carrying channeled information at other electromagnetic wavelengths/frequencies in media such as microwave transmission lines. Advantages of optical media are, among others, high channel (band-width), greater immunity to electromagnetic interference, and lower propagation loss. In fact, it is common for high-speed optical communications systems to have signal rates in the range of approximately several Gigabits per second (Gbit/sec) to several tens of Gbit/sec.

The above-described recent demand for fiber optic communications is accompanied by a demand for reliable and readily manufacturable optical equipment components for holding an optical waveguide, e.g. an optical fiber(s). Such components may include optical fiber ferrules, and optical switches for selectively coupling optical fibers or the like. The optical fiber ferrule is a commonly utilized component of an optical fiber connector.

FIG. 1 schematically shows an element of a component of optical communications equipment in cross section. Typically, the element will include a holding member 10 defining one or more grooves 11 that constitute a passageway or passageways through the component. The passageway(s) is/are sized to accommodate a waveguide, e.g., an optical fiber(s) 12.

SUMMARY

An aspect of the present invention is to provide a method of making a three-dimensional structure having surface features of a predetermined size from a substrate.

A more specific aspect of the present invention is to provide a method of forming one or more grooves in a substrate that can accommodate an optical waveguide. Still further, another more specific aspect of the present invention is to provide a method of forming one or more parabolic or aspherical features in a substrate for use as lenslets.

According to the present invention, a heterogeneous film having a composition that varies in the direction of its thickness is first formed on the substrate. The composition of the film is selected so that the film can be etched at a rate that varies in the direction of its thickness. Useful examples of such thin films are those Silicon oxide and nitrides created by means of the technique known as Chemical Vapor Deposition, in which a precursor-bearing vapor is delivered with other reagents into a hot partial vacuum and/or plasma environment whereupon breakdown and condensation of the vapor upon the substrate results in deposition of the film. By varying the ratios of the constituent precursor and reagent vapors and/or dry gases in situ in the deposition process, a continuum of graded stoichiometry can easily be achieved in such films. This varying of gas ratios may be performed in set steps, each of pre-determined duration, or made continuous at a specified rate of change to control the "slope" of the grade in stoichiometry in the z-direction (direction of thickness) of the film. Adjusting the Nitrous oxide to Silane ratio in a typical oxynitride plasma-enhanced chemical vapor deposition process for example, will result in a leanness or richness of Silicon in the film. With a photoresist, or "soft" mask deposited on the heterogeneous film, the film is isotropically etched, whereby the film is patterned. Next, the structure comprising the patterned heterogeneous film is etched, during which process the film is eroded, causing increasing amounts of the substrate to become exposed to the etchant throughout the process.

In this way, the pattern of the heterogeneous film is in effect transferred to the substrate. However, the selectivity of the etch process(es) allows the surface features formed in the substrate to have shapes that are different from the shape embodied by the patterned heterogeneous film itself (i.e., a transfer function exists). For example, in one embodiment, relatively shallow openings in the heterogeneous film are used to form deep pits or grooves in the substrate. These deep pits or grooves could be used as channels having the potential, because of their shape, for various uses such as for accommodating optical waveguides. In another embodiment, convex bumps of a given sag are patterned in the heterogeneous film and used to form aspherical or parabolic surface features in the substrate. These surface features could be used as lenslets.

BRIEF DESCRIPTION OF THE DRAWINGS

These and other objects, features and advantages of the present invention will become more apparent from the following detailed description of the preferred embodiments thereof made with reference to the accompanying drawings, of which.

DETAILED DESCRIPTION OF THE INVENTION

Figure 1:
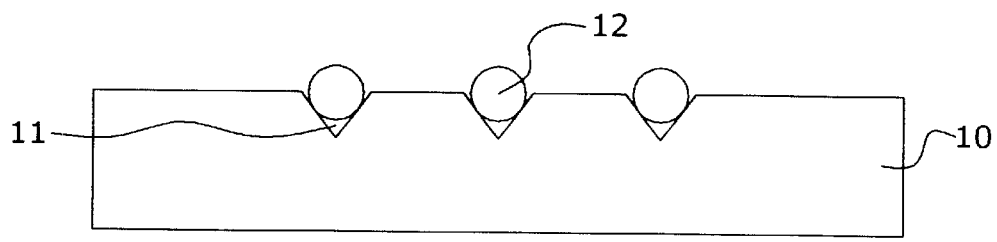
FIG. 1 (prior art) is a schematic sectional view of an element of an optical component.

The present invention will now be described in more detail with reference to the accompanying drawings. In the drawings, the thicknesses and relative sizes of the various layers of the structures are exaggerated for the sake of clarity. Also, like numerals designate like elements throughout the drawings.

Figure 2:
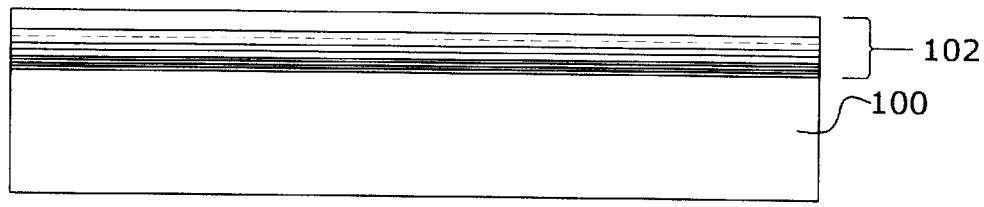
FIGS. 2–6 are each a sectional view of a substrate and collectively show the steps in a first embodiment of a method of forming a 3-D structure from the substrate according to the present invention.

Referring now to FIG. 2, a method of making a three-dimensional (3-D) structure begins by forming a heterogeneous film 102 on a substrate 100, e.g., a silicon substrate. The film is heterogeneous in that it has a composition that varies in the direction of its thickness. As will be described later on in more detail, the heterogeneous film 102 is designed to etch at different rates throughout its thickness. Accordingly, the etch rates of the film 102 may vary continuously or in a step-wise manner from top to bottom. To this end, the heterogeneous film 102 may be formed of a material whose stoichiometry varies throughout, or by sequentially forming layers of different materials on the substrate 100. Preferably, the layers of the heterogeneous film 102 are formed/selected such that the film will etch at a rate that is faster at the upper portion thereof than at the lower portion thereof that is adjacent the substrate 100. Examples of the composition of the heterogeneous film 102 are as follows:

(1) Silicon nitride/silicon dioxide
(2) Silicon dioxide/phosphosilicate glass (PSG)
(3) Polysilicon/silicon nitride
(4) Polysilicon/silicon dioxide
(5) Silicon nitride/PSG
(6) Silicon nitride layers of varied stoichiometries
(7) Silicon oxide/nitride layers of varied stoichiometries capped by a metal thin film layer(s) such as Titanium, Chromium, or Aluminum Also, the heterogeneous film 102 may comprise a combination of materials selected from the list above.

Figure 3:
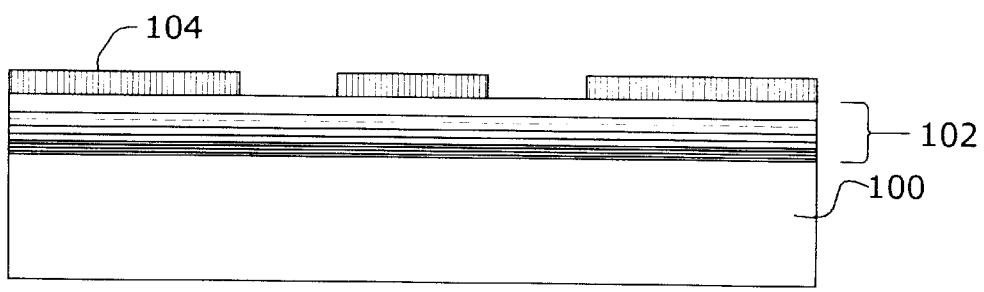

Next, as shown in FIG. 3, an etch mask 104 is formed on the heterogeneous film 102. The etch mask 104 exposes a selected portion 102a of the heterogeneous film and may be formed by techniques that are well known, per se. For instance, the mask 104 may be formed by a photolithographic technique in which a photoresist is deposited on the film 102, the photoresist is exposed to light projected thereon in a certain pattern, and the exposed photoresist is then developed, whereby the photoresist is patterned. Although such a photoresist is preferably used as the mask 104, the mask 104 may alternatively comprise a metal layer that has in turn been patterned by a photolithography and etch technique. In any case, the composition of the mask 104, as well as the pattern thereof, is designed/selected based on the subsequent etch process to yield the final desired shape of the substrate as again, will become clear from the following description.

Figure 4:
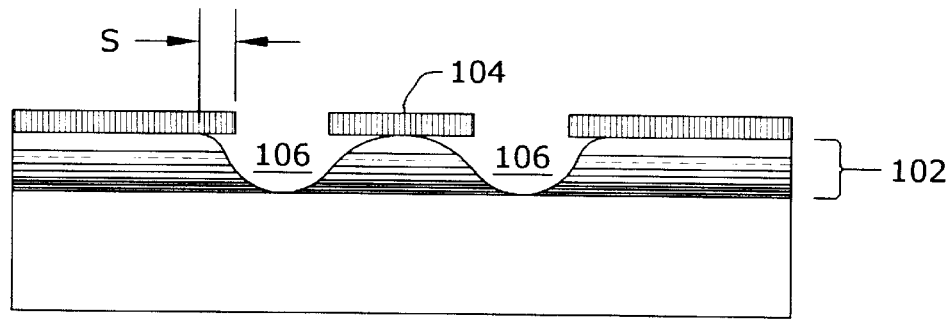

Referring now to FIG. 4, the heterogeneous film 102 is then isotropically etched using the mask 104 as an etch mask, whereby the film 102 is patterned. That is, an opening 106 is formed in the selected portion of the film 102 that was exposed by the mask 104. The shape of the opening 106 is dictated by the composition of the heterogeneous film 102 and the etchant. For example, in the case in which the etch rate of the heterogeneous film 102 is greatest at the upper portion of the film, the opening 106 will have the shape of a bowl or crater, i.e., the top of the opening 106 will be substantially wider than the bottom thereof.

In certain combinations of etching processes and compositions of the heterogeneous film 102, the mask 104 will be undercut, whereby the mask 104 assumes the form of a cantilever. The cantilevered mask 104 is characterized by an overhanging section of length "S", namely the length by which the mask 104 is undercut and therefore projects over the opening 106 that has been etched in the film 102. Slope lengths that are twenty to fifty and as great as one hundred times the thickness of the heterogeneous film 102 are possible given the materials and thickness controls that are available for the film 102 deposition and etching processes that are well-known, per se, such as known Hydrofluoric acid or Ammonium Fluoride bearing buffered oxide etch (B.O.E.) processes.

Figure 5A:
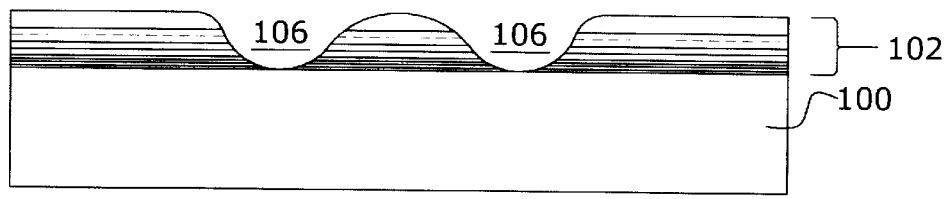
Figure 5B:
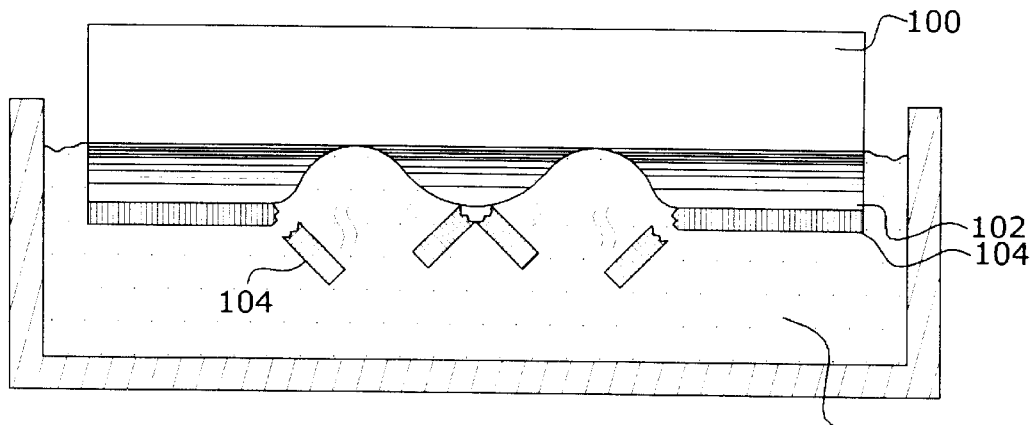

As shown in FIG. 5A, the mask 104 is removed. When the isotropic etching of the heterogeneous film 102 is carried out using a wet etch process that produces a relatively long length "S", the structure should be inverted in the bath of etchant. Consequently, overhanging portions the mask 104 will fall away from the etched heterogeneous film 102, as shown in FIG. 5B.

The patterned heterogeneous film 102 will serve as an erodable mask for shaping the substrate 100. That is, the structure comprising the patterned heterogeneous film is etched to erode the film 102 and correspondingly transfer a shape into the substrate 100. Processes that are suitable for use as this final etch process include "dry" plasma reactive ion etching (not anisotropic), anisotropic deep reactive ion etching (DRIE) and isotropic wet etching using HNA (Hydrofluoric/Nitric/Acetic acid mixture), for example.

Figure 6:
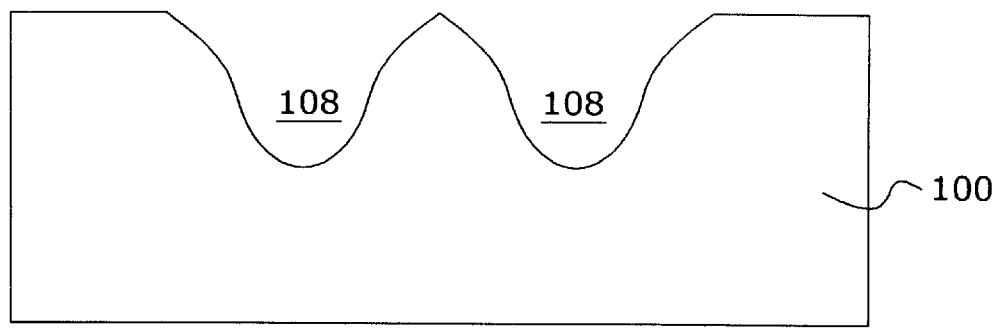

The selectivity of this final etch process influences the shape of the features formed in the substrate 100. In the example shown in FIG. 6, a pit 108 having a particular contour or profile is formed in the substrate 100. Note, in this step, the patterned heterogeneous film does not need to be entirely removed. Rather, a thin layer of the original film 102 may remain on the substrate 100 after the final etch process.

In any case, the final etch process has a selectivity, or preferential rate of attack, by which the patterned heterogeneous film 102 and the substrate 100 will be etched at different rates so that the features produced in the substrate 100 do not necessarily replicate the pattern of the heterogeneous film 102. If the final etch process etches the patterned heterogeneous film 102 at a rate that is a fraction of that at which the substrate 100 is etched, the pit 108 formed in the substrate will have a depth that is greater than that of the depth of the opening 106 in the film 102. The higher the etch selectivity, the deeper are the features that can be produced in the substrate. Assuming that the different materials which make up the heterogeneous film 102 are etched at the same rate by the final etch process (as the different etching layers may be made to different thicknesses to compensate for their otherwise different etch rates), the shapes (contour) of the pits 108 will be similar to those of the openings 106. On the other hand, if the final etch process chosen has different etch selectivities with respect to various materials constituting the heterogeneous film 102, as will more often be the case, the patterned film 102 will erode at different rates in the direction of its thickness. Consequently, pits 108 having shapes that are different than those of the openings 106 in the film 102 will be formed in the substrate, as a function of the thickness and the etch selectivity of each individual layer in the film stack, if mask 102 is composed of discrete layers.

For example, if the final etch process etches the patterned heterogeneous film 102 at a rate that is a fraction, say one half that at which the substrate 100 is etched, the pit 108 formed in the substrate will have a depth that is the inverse multiple, in this case double, that of the depth of the corresponding opening 106 in the film 102. In this way, deep contoured pits can be formed from a heterogeneous film 102 having shallow holes. Deep features, e.g. pits having depths on the order of hundreds of microns, may be formed in the substrate 100 using DRIE or a wet etchant because these processes can be highly preferential to etch the Silicon of the substrate 100 over the composition of the heterogeneous film 102. Therefore, basically speaking, the shape of the features formed in the substrate are dependent on the composition of the heterogeneous film, the etchant used in the isotropic etching process shown in FIG. 3, and the etchant and etch technique used in the final etch process.

In a specific example of the first embodiment, the heterogeneous film 102 is made of respective layers of $SiO_2$ and SiN, and has a thickness of 0.5 to 10 microns, and preferably 1 to 4 microns. The final etching process uses an $SF_6/O_2$ plasma as an etchant, capable of providing an etch selectivity of 40:1 to 100:1 or even higher under certain known processing conditions. In this case, a heterogeneous film that is only three microns thick can be used to form pits in the substrate that are three hundred microns deep. If, for example, the DRIE process is carried out under cryogenic conditions, the etch selectivity can be increased to 1000:1.

Figure 7:
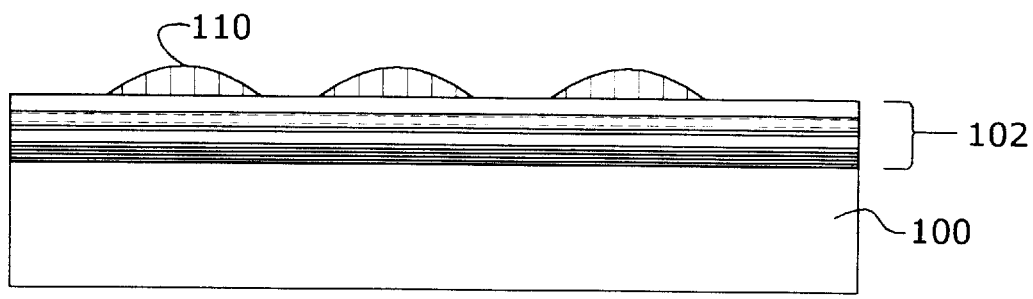
FIGS. 7–9 are each a sectional view of a substrate and collectively show the steps in a second embodiment of a method of forming a 3-D structure from the substrate according to the present invention.

Next, a second embodiment of the present invention will be described with reference to FIGS. 7–9.

As in the first embodiment, a stoichiometrically heterogeneous film 102 is formed on a substrate 100, e.g., a Silicon substrate. Then, as shown in FIG. 7, a mask 110 of a contoured (i.e., not binary) photoresist is formed on the heterogeneous film 102 by grayscale masking or reflow techniques. Basically, as shown in the figure, a plurality of contoured mask portions are produced on the heterogeneous film 102. Each of the mask portions has a side wall that subtends an acute angle with respect to the plane of the upper surface of the heterogeneous film 102, in contrast to the first embodiment in which the side walls of the mask extend substantially orthogonal to the plane of the upper surface of the film.

Next, the structure comprising the patterned grayscale mask 110 is etched using a dry etch process such as RIE to transfer the pattern of the grayscale mask to the heterogeneous film 102 and thereby pattern the film 102. In this step, the etching process may be carried out until a selected portion of the substrate 102 is exposed to the etchant by the eroding resist.

Figure 8:
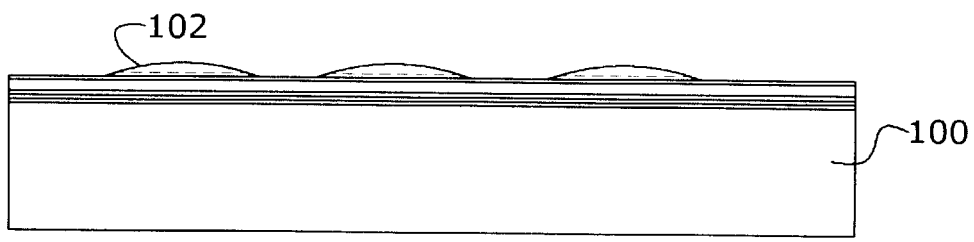
Figure 9:
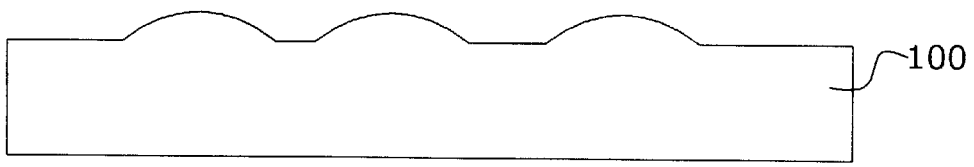

Finally, as shown in FIGS. 8 and 9, the structure comprising the patterned heterogeneous film 102 is etched, whereupon the film 102 is eroded and the substrate 100 is correspondingly shaped. This final etching process may also comprise RIE.

In this embodiment, as should be apparent from the description above, the shape of the features formed in the substrate 102 depend upon the selectivity of the (reactive ion) etch process used to transfer the pattern of the grayscale mask 110 to the heterogeneous film 102, and the selectivity of the final etch process used to transfer the pattern of the heterogeneous film to the substrate 100. In particular, the selectivities of both of the etch processes (FIGS. 7 and 8) will vary locally as a function of position (in the direction of thickness) in the heterogeneous film 102. Therefore, a relatively simplistic pattern of the grayscale mask 110 can be used to form complex shapes in the substrate 100. That is, the method of this embodiment does not necessarily constitute simply a proportional vertical scaling of the pattern of the grayscale mask. For example, a semi-spherical portion of the patterned grayscale mask may be used to form a parabolic feature in the substrate.

Although the present invention has been shown and described with respect to the preferred embodiments thereof, various changes, as will be readily apparent to those of ordinary skill in the art, can be made thereto without departing from the spirit and scope of the invention as defined by the appended claims.

What is claimed is:

1. A method of making a three-dimensional structure, comprising:

forming, on a substrate, a heterogeneous film having a composition that varies in the direction of its thickness;

forming a mask on the heterogenous film;

with the mask disposed on the heterogeneous film, etching the heterogeneous film with an etchant at a rate that varies in the direction of the thickness of the heterogeneous film, to thereby pattern the heterogeneous film; and etching the patterned heterogeneous film to erode the patterned heterogeneous film and correspondingly shape the substrate as the patterned heterogeneous film is so being eroded.

2. The method as claimed in claim 1, wherein said forming of a mask on the heterogeneous film comprises forming an etching mask that exposes a selected portion of the heterogeneous film, and said etching of the heterogeneous film comprises forming an opening in the heterogeneous film.

3. The method as claimed in claim 2, wherein said etching of the heterogeneous film comprises submerging the mask and patterned heterogeneous film in a bath of etchant in an inverted state in which the mask is face down, thereby preventing cantilevered undercut portions of the mask material from re-depositing onto the surface of the substrate to be etched.

4. The method as claimed in claim 2, wherein said etching of the heterogeneous film comprises etching the heterogeneous film at a rate that is faster at an upper portion thereof than at a lower portion thereof adjacent the substrate.

5. The method as claimed in claim 2, wherein said etching of the patterned heterogeneous film comprises reactive ion etching.

6. The method as claimed in claim 2, wherein said etching of the patterned heterogeneous film comprises wet etching.

7. A method of making a three-dimensional structure, comprising:

forming, on a substrate, a heterogeneous film having a composition that varies in the direction of its thickness;

forming a mask on the heterogeneous film;

with the mask disposed on the heterogeneous film, etching the heterogeneous film with an etchant at a rate that varies in the direction of the thickness of the heterogeneous film, to thereby pattern the heterogeneous film; and etching the patterned heterogeneous film and said substrate at different rates wherein the patterned heterogeneous film is eroded and the substrate is correspondingly shaped as the patterned heterogeneous film is so being eroded.

8. The method as claimed in claim 7, wherein the patterned heterogeneous film includes a hole, and wherein said etching of the patterned heterogenous film comprises etching the patterned heterogeneous film at a uniform rate in the direction of its thickness, whereby a pit having a depth different than that of the hole in the film is formed in the substrate.

9. The method as claimed in claim 7, wherein said patterned heterogeneous film includes a hole and wherein said etching of the patterned heterogeneous film comprises using a process having different etch selectivities with respect to various materials constituting the heterogeneous film, whereby the patterned film erodes at different rates in the direction of its thickness.

10. The method as claimed in claim 7, wherein the substrate is a silicon substrate, said forming of a heterogeneous film comprises forming discrete layers of SiO2 and SiN on the silicon substrate, and said etching of the patterned heterogeneous film comprises plasma etching using an SF6/O2 plasma.

11. A method of making a three-dimensional structure, comprising:

forming, on a substrate, a heterogeneous film having a composition that varies in the direction of its thickness;

forming a plurality of contoured mask portions on the heterogeneous film, each of said mask portions having a side wall that subtends an acute angle with respect to the plane of the upper surface of the heterogeneous film;

with the mask disposed on the heterogeneous film, etching the heterogeneous film with an etchant at a rate that varies in the direction of the thickness of the heterogeneous film, to thereby pattern the heterogeneous film; and etching the patterned heterogeneous film to erode the patterned heterogeneous film and correspondingly shape the substrate as the film is so being eroded.

12. The method as claimed in claim 11, wherein said etching of the patterned heterogeneous film comprises etching said patterned heterogeneous film and said substrate at different rates.

13. The method as claimed in claim 11, wherein said etching of the patterned heterogeneous film comprises dry plasma etching.

14. The method as claimed in claim 11, wherein said etching of the patterned heterogeneous film comprises isotropic etching.

15. The method as claimed in claim 14, wherein said isotropic etching of the heterogeneous film comprises dry plasma etching.

* * * * *